United States Patent
Ogawa et al.

(10) Patent No.: US 7,097,784 B2
(45) Date of Patent: Aug. 29, 2006

(54) ETCHING METHOD AND APPARATUS FOR SEMICONDUCTOR WAFERS

(75) Inventors: Yoshihiro Ogawa, Yokohama (JP); Hisashi Okuchi, Yokohama (JP); Hiroshi Tomita, Yokohama (JP); Hiroyasu Iimori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 123 days.

(21) Appl. No.: 10/742,992

(22) Filed: Dec. 23, 2003

(65) Prior Publication Data

US 2004/0157452 A1 Aug. 12, 2004

(30) Foreign Application Priority Data

Dec. 27, 2002 (JP) ............................. 2002-378799

(51) Int. Cl.
*B44C 1/22* (2006.01)
*C03C 15/00* (2006.01)

(52) U.S. Cl. ............................. 216/84; 216/83; 216/92; 216/93; 134/1.3; 134/30; 156/345.11; 438/745

(58) Field of Classification Search .................. 216/83, 216/84, 92, 93; 134/1.3, 30; 156/345.11; 438/745

See application file for complete search history.

(56) References Cited

U.S. PATENT DOCUMENTS

| 4,980,017 | A | * | 12/1990 | Kaji et al. ..................... 216/93 |
| 5,843,850 | A | * | 12/1998 | Shin et al. ................... 438/757 |
| 6,001,215 | A | * | 12/1999 | Ban ....................... 156/345.15 |
| 6,255,123 | B1 | * | 7/2001 | Reis ............................... 438/8 |

FOREIGN PATENT DOCUMENTS

| JP | 02-073632 | 3/1990 |
| JP | 05-036670 | 2/1993 |
| JP | 06-084870 | 3/1994 |
| JP | 7-230981 | 8/1995 |
| JP | 9-129588 | 5/1997 |
| JP | 11-145107 | 5/1999 |
| JP | 11-168081 | 6/1999 |
| JP | 11-186217 | 7/1999 |
| JP | 2001-023952 | 1/2001 |
| JP | 2001-23952 A | 1/2001 |

OTHER PUBLICATIONS

"Notification of Reasons for Rejection" issued by the Japanese Patent Office for Japanese Patent Application Serial No. 2002-378799, and English translation thereof.

* cited by examiner

*Primary Examiner*—Shamim Ahmed
(74) *Attorney, Agent, or Firm*—Finnegan, Henderson, Farabow, Garrett & Dunner, L.L.P.

(57) ABSTRACT

A method for etching semiconductor wafers in an etching apparatus including an etching bath filled with an etchant and capable of setting liquid temperature and process sequence, comprises selecting a predetermined etching program suitable for etching of the semiconductor wafer, counting the number of the semiconductor wafers to be charged in the etching bath before the etching, calculating a temperature drop of the etchant based on the counted number, setting the liquid temperature of the etchant to an initial temperature B obtained by adding the temperature drop of the etchant to a predetermined etching temperature A, charging the semiconductor wafers in the etching bath at a predetermined timing to etch the semiconductor wafers, and setting the liquid temperature at the predetermined etching temperature A, immediately before or after the liquid temperature reaches the initial temperature B.

7 Claims, 5 Drawing Sheets

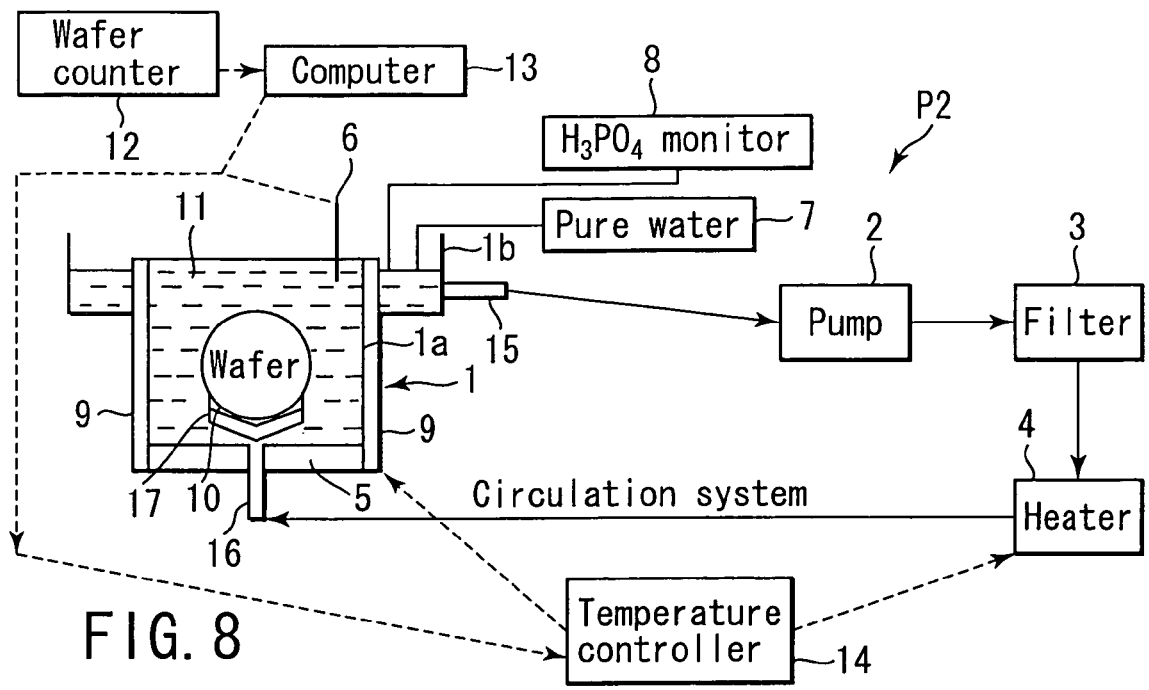
FIG. 8
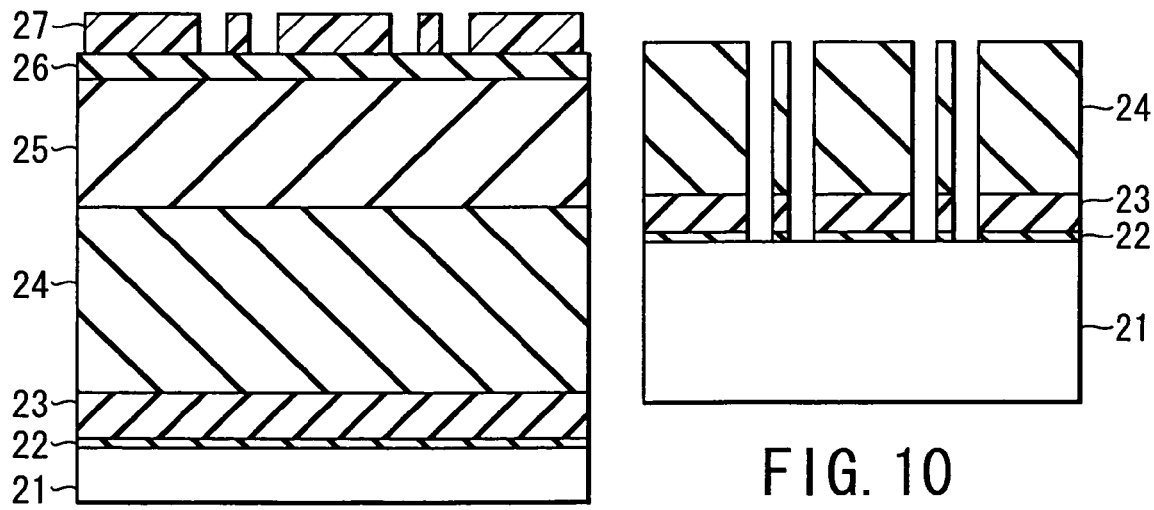
FIG. 9
FIG. 10
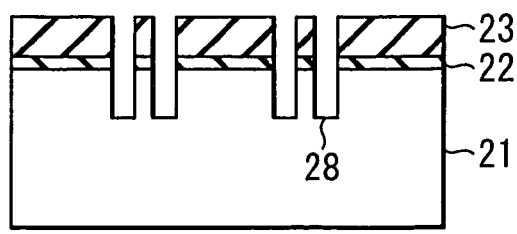
FIG. 11
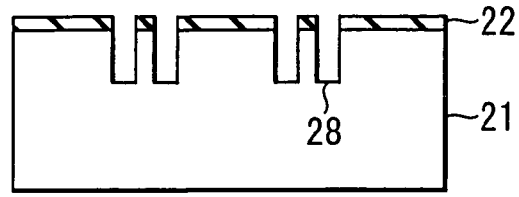
FIG. 12

ETCHING METHOD AND APPARATUS FOR SEMICONDUCTOR WAFERS

CROSS-REFERENCE TO RELATED APPLICATIONS

This application is based upon and claims the benefit of priority from the prior Japanese Patent Application No. 2002-378799, filed Dec. 27, 2002, the entire contents of which are incorporated herein by reference.

BACKGROUND OF THE INVENTION

1. Field of the Invention

The present invention relates to an etching method for semiconductor wafers, particularly a method for use in etching a semiconductor substrate on which a fine pattern exists, and to an etching apparatus.

2. Description of the Related Art

When a semiconductor device is manufactured, a silicon nitride film (SiN film) is variously used in a step of forming semiconductor devices such as an integrated circuit in a semiconductor device forming region of a semiconductor wafer (hereinafter referred to as a wafer). For example, the film is used as a mask material for use in forming a deep trench to form capacitors in a device forming region of the wafer including a silicon semiconductor substrate. The film is also used as an insulating film which protects gate electrode materials such as polysilicon in patterning a gate electrode, and as a protective film which protects the back surface of the silicon semiconductor substrate from corrosion, damage, and the like during various processes.

Acids such as phosphoric acid are usually used to etch/remove the silicon nitride film (SiN film) deposited on a semiconductor substrate. When phosphoric acid is used, $H_3PO_4$ is charged as an etchant at about 140 to 170° C. in an etching bath constituting an etching apparatus, the wafer is charged in the bath to perform etching. Thereafter, pure water cleaning is carried out, and drying is then carried out to end the etching.

A wet etching method and apparatus using phosphoric acid are disclosed, for example, in Jpn. Pat. Appln. KOKAI Publication No. 11-168081. In the etching apparatus of this document, a plurality of silicon wafers are charged in the etching bath filled with an etchant formed of an $H_3PO_4$ solution. The etching bath is connected to a discharge pipe and supply pipe, and these pipes are connected to a circulation system of the etchant, including a pump, filter, line heater, and the like.

The etchant in the etching bath is circulated in the circulation system by the pump, and impurities are removed by the filter. Furthermore, the etchant is heated to the predetermined temperature by the line hater, and returned as clean etchant again to the etching bath.

The solvent of the $H_3PO_4$ solution, that is, water easily evaporates. Therefore, pure water is appropriately replenished to keep the etchant at a constant temperature of 155° C. or more. Furthermore, in this apparatus, the top surface of the etching bath is opened in an initial stage of heating, droplets are prevented from dropping into the etchant due to condensation, and this prevents the droplets from being boiled or the temperature of the etchant from dropping. Therefore, the etchant heating can be quickly completed.

On the other hand, a method of managing a concentration of a phosphoric acid etchant is described, for example, in Jpn. Pat. Appln. KOKAI Publication No. 9-129588, and an example of a phosphoric acid concentration management system by measurement of electric conductivity is described.

Moreover, in Jpn. Pat. Appln. KOKAI Publication No. 2001-23952, in order to prevent silicon from being dissolved from the semiconductor wafer and to prevent the etching rate from fluctuating, a method is disclosed in which a predetermined amount of etchant is discharged, when a silicon concentration reaches a certain value, and a new etchant is replenished to control the etching rate. In this technique, the etchant is maintained in a boiled state at a predetermined temperature to keep the phosphoric acid concentration in the etchant substantially constant.

Furthermore, in Jpn. Pat. Appln. KOKAI Publication No. 11-145107, a technique is disclosed in which the etchant is constantly kept in the boiled state, and the pure water is replenished so as to hold the etchant at the predetermined temperature.

Additionally, in Jpn. Pat. Appln. KOKAI Publication No. 7-230981, a method is described in which a change of the concentration of the phosphoric acid etchant is sensed by a fluctuation in the number of strokes of a stroke pump, and an aqueous phosphoric acid solution is replenished to manage the concentration of the etchant. At this time, the solution is kept at 150° C. by a temperature adjustment unit.

Moreover, it is known that the phosphoric acid etching for the silicon nitride film (SiN) is sensitive at the temperature of $H_3PO_4$. Therefore, when the wafer is charged in the etching bath, the temperature of the $H_3PO_4$ etchant fluctuates. Furthermore, the fluctuation width also changes with the number of wafers per batch to be charged. Therefore, there is a problem that the SiN etching amount fluctuates, when a certain treatment is performed for an etching time.

Therefore, there has been a demand for realization of an etching method in which the etching is possible with an even etching amount of the SiN film on the wafer and with high precision among batches or in the batch, and an etching apparatus for carrying out the method.

BRIEF SUMMARY OF THE INVENTION

According to a first aspect of the invention, there is provided a method for etching semiconductor wafers in an etching apparatus including an etching bath filled with an etchant and capable of setting liquid temperature and process sequence, which comprises selecting a predetermined etching program suitable for etching of the semiconductor wafer, counting the number of the semiconductor wafers to be charged in the etching bath before the etching, calculating a temperature drop of the etchant based on is the counted number, setting the liquid temperature of the etchant to an initial temperature B obtained by adding the temperature drop of the etchant to a predetermined etching temperature A, charging the semiconductor wafers in the etching bath at a predetermined timing to etch the semiconductor wafers; and setting the liquid temperature at the predetermined etching temperature A, immediately before or after the liquid temperature reaches the initial temperature B.

According to a second aspect of the invention, there is provided an apparatus for etching semiconductor wafers, which comprises an etching bath in which an etchant is filled, a counter which counts the number of silicon wafers to be charged in the etching bath before charging the wafers into the etching bath, a computer which calculates a temperature drop of the etchant at a time of charging the semiconductor wafers based on the number of wafers, and set an initial temperature B of the etchant at the time of charging the semiconductor wafers to be higher than a predetermined etching temperature A by the temperature drop, a first heater disposed on at least a part of an outer wall of the etching bath, and a temperature adjustment unit which controls heating of the first heater to control a temperature of the etchant at the initial temperature B or the predetermined etching temperature A.

BRIEF DESCRIPTION OF THE SEVERAL VIEWS OF THE DRAWING

FIG. 8 is a diagram showing the system of the etching apparatus of a second embodiment;

FIGS. 9 to 12 are sectional views of a semiconductor device showing an SiN film etching step at the time of the forming of a deep trench in a first application example of the etching method of the present invention;

DETAILED DESCRIPTION OF THE INVENTION

Figure 1:
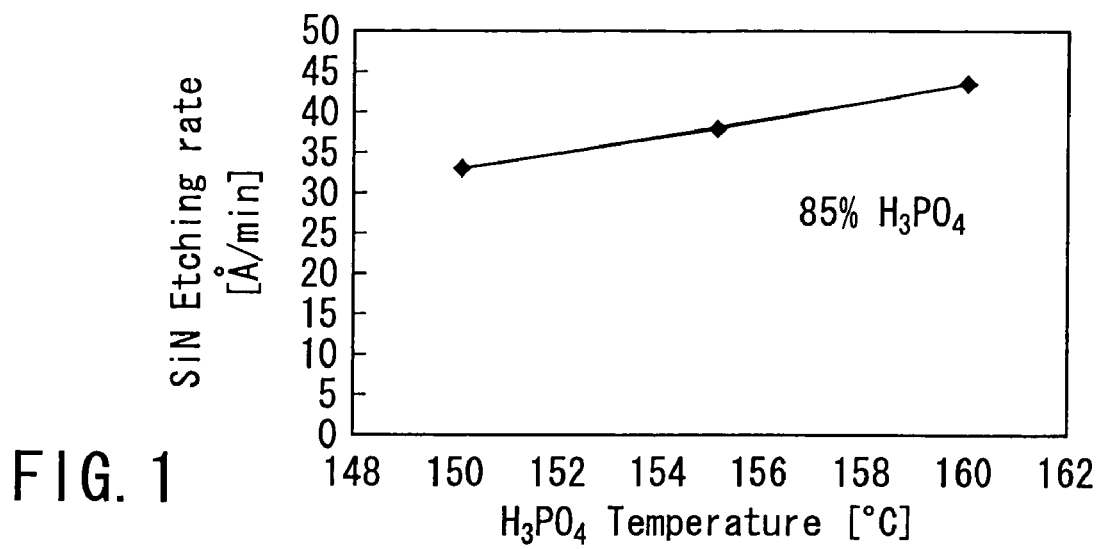
FIG. 1 is a graph showing a relation between $H_3PO_4$ treatment temperature and SiN etching rate.

A problem of an etching method of a semiconductor wafer to be treated in embodiments will be described prior to the description of the embodiments. As described above, it is known that phosphoric acid etching against a silicon nitride film (SiN film) is sensitive at temperature of $H_3PO_4$. For example, as shown in FIG. 1, with an etchant formed of $H_3PO_4$ having a concentration of 85 wt %, the SiN film is etched at 155° C. by about 38 angstroms, and at 160° C. by about 43 angstroms. It is to be noted that in FIG. 1, the abscissa shows the $H_3PO_4$ temperature (° C.) and the ordinate shows an etching rate (A/min) of the SiN film.

Figure 2:
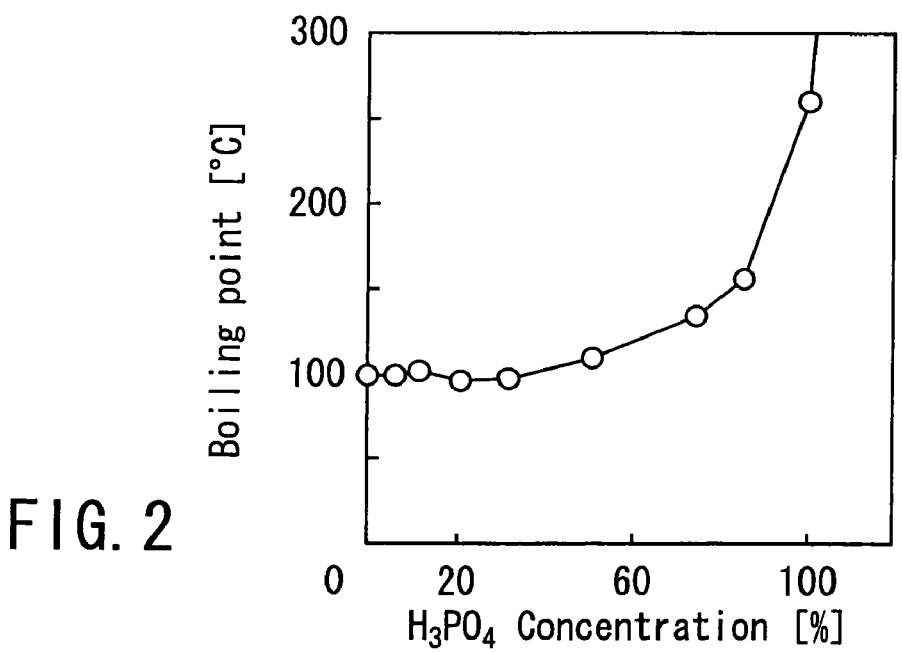
FIG. 2 is a graph showing a relation between $H_3PO_4$ concentration and boiling point.

Moreover, FIG. 2 is a graph showing a relation between phosphoric acid $H_3PO_4$ concentration and boiling point. The temperature of the $H_3PO_4$ etchant has heretofore been adjusted using a property that a boiling point differs with a concentration, and pure water is replenished in such a manner that the boiling point is constant.

Figure 3:
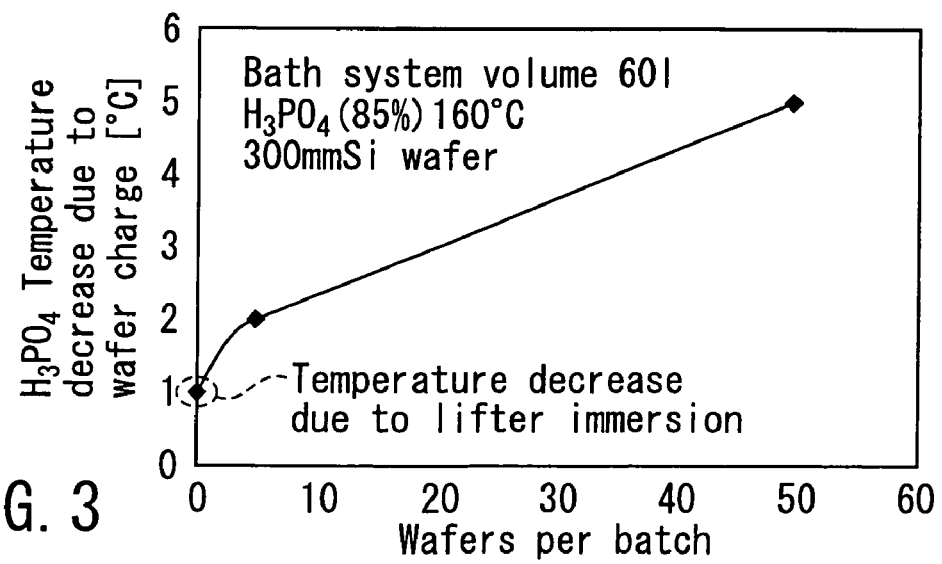
FIG. 3 is a graph showing a relation between the number of wafers per batch and temperature change of an $H_3PO_4$ etchant.

Additionally, the temperature of the $H_3PO_4$ etchant fluctuates at the time the wafer is charged into the etching bath. Additionally, the fluctuation width also changes with the number of wafers per batch to be charged. FIG. 3 shows a relation between the number of wafers per batch and a temperature drop of the $H_3PO_4$ etchant having a concentration of 85 wt %. In the example, a capacity of a solution bath and circulation system is 60 l, solution temperature is 160° C., and a 300-mm Si wafer is used. It is seen from FIG. 3 that there is a solution temperature drop of 5° C., when the number of wafers per batch is 50. Additionally, it is confirmed that there is a solution temperature drop of 1° C. caused only by a lifter (holder) for holding the wafer.

Thereafter, when a treatment is carried out for a certain time, there has been a problem that the temperature of the etchant fluctuates by the number of wafers per batch, and an SiN etching amount fluctuates. Therefore, there has been a demand for realization of an etching method of the wafer in which high-precision etching is possible with an even etching amount of the SiN film on the wafer among batches or in the batch even with the use of the batches including different numbers of wafers, and an etching apparatus for carrying out the method.

It is to be noted that the even etching amount among the batches indicates that even when the batch is changed to perform the etching, the etching amount of the SiN film in the wafer included in the batch is uniform. The even etching amount in the batch indicates that the etching amount of the SiN film in a plurality of wafers contained in any batch is even in the batch.

The embodiments of the present invention will hereinafter be described with reference to the drawings.

FIRST EMBODIMENT

Figure 4:
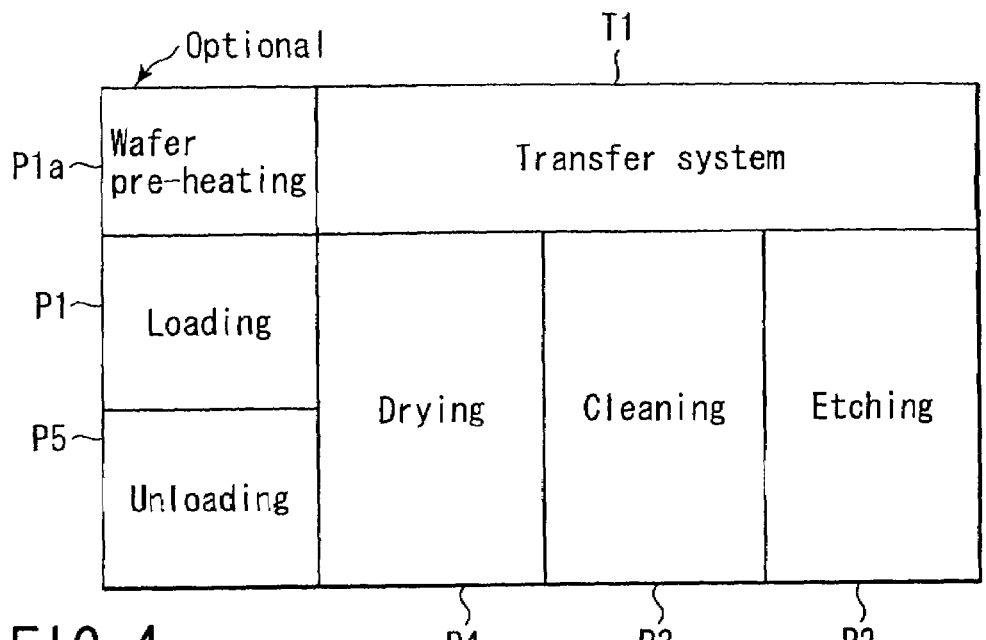
FIG. 4 is a basic configuration diagram of an etching apparatus for use in the embodiments of the present invention.

FIG. 4 is a basic configuration diagram of an etching apparatus for use in the embodiments of the present invention. Wafers to be etched are laid in a batch size of about 25 to 50 wafers on a carrier, and brought into a loading portion P1. After selecting an etching program (recipe) for use, start of an operation is instructed. Then, the wafers are carried to an etching portion P2 by a robot of a transfer system T1. Here, the wafers remain to be laid on the carrier, transferred onto a lifter (see FIG. 6, described later) which is formed with a heat capacity smaller than that of the carrier, and thereafter charged into the etching bath.

The wafer which has been etched is transferred to a cleaning portion P3, and cleaned with pure water. The wafer which has been cleaned is transferred to a drying portion P4 and dried by spin drying. The wafer which has been dried is transferred to an unloading portion and shipped.

Figure 5:
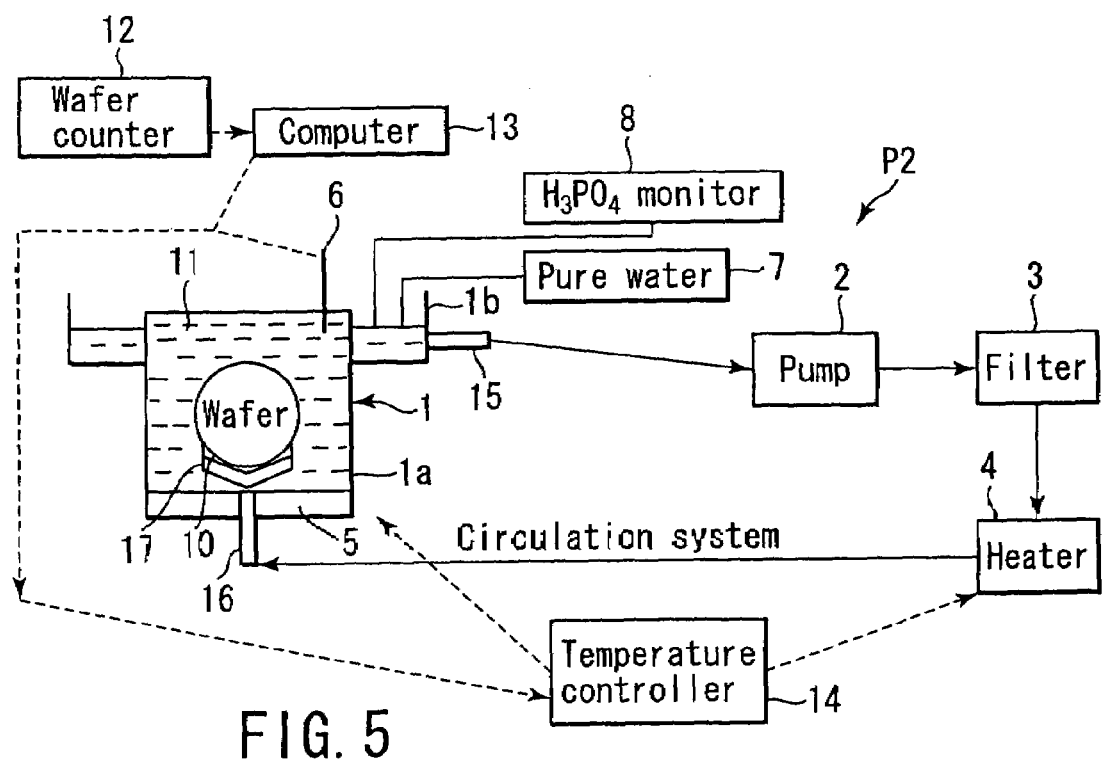
FIG. 5 is a diagram showing a system of the etching apparatus of a first embodiment.

FIG. 5 is a configuration diagram of the etching portion P2. That is, the etching portion P2 includes an etching bath 1 in which an etchant 11 formed of $H_3PO_4$ solution is charged, an inner bath 1a into which a plurality of silicon wafers 10 are charged, and an outer bath 1b which receives an etchant overflowing from the inner bath 1a.

The outer bath 1b of the etching bath 1 is connected to an outlet pipe 15. The bath is constituted in such a manner that the etchant flows back to the inner bath 1a from a supply pipe 16 via a circulation system constituted of a pump 2, filter 3, and heater 4. It is to be noted that solid arrows in FIG. 5 show the circulation system.

The etchant 11 in the etching bath 1 is circulated in the circulation system by the pump 2, and impurities are removed by the filter 3. The etchant 11 is heated at a predetermined temperature by the heater 4 and supplied as the clean etchant again to the etching bath 1. The etchant 11 is heated by the heater 4 and is also heated by a heater 5 attached to the lower outer part of the etching bath 1 in order to be kept at a predetermined temperature.

Since the solvent of an $H_3PO_4$ solution, that is, water easily evaporates, pure water 7 is appropriately charged to keep the concentration of the etchant 11 to be constant. The temperature of the etchant 11 is detected by a thermocouple 6, and the concentration of the etchant 11 is detected by an $H_3PO_4$ concentration monitor 8.

As means for measuring the concentration of the etchant 11, any of known methods such as a method of estimating the concentration from an electric conductivity, by an optical technique, or from specific gravity can be used.

Moreover, this etching apparatus includes a wafer counter 12, and a computer 13 for calculating the temperature to be indicated on a temperature controller 14 based on information from a wafer counter 12. The temperature controller 14 drives the heaters 4, 5, and controls the temperature of the etchant 11 at a desired temperature based on an instruction from the computer 13. It is to be noted that dotted arrows in FIG. 5 indicate paths of information and control.

Next, the etching method using this etching apparatus will be described with reference to a flowchart of FIG. 7. First, the wafers contained in the carrier are loaded in the loading portion P1 (step 0), and a recipe to be applied to an etching material is selected from a plurality of recipes in which process sequences or conditions are programmed (step 1).

After selecting the recipe, the number of wafers is counted by the wafer counter 12, before the wafers 10 are charged into the etching bath 11 (step 2). An automatic counter for optically and automatically counting the wafers can be used in the counter 12. To effectively use a time until the liquid temperature rises at a predetermined temperature, it is preferable to count the number of wafers as early as possible in a stage in which the wafers are conveyed to the etching bath.

Figure 6:
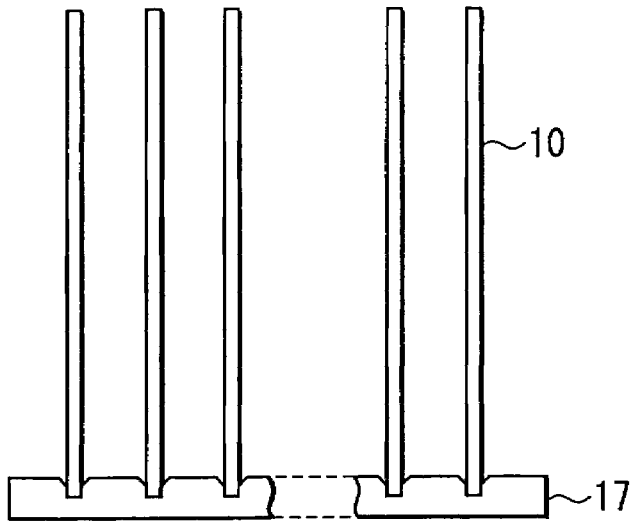
FIG. 6 is a diagram of a wafer holder for use in the embodiments of the present invention.

In consideration of the temperature drop of the etchant at the time of the charging of the wafers, the temperature B of the etchant at the time of the charging of the wafers is calculated from the number of wafers, wafer volume, specific heat, heat capacity of the lifter, and the like (step 3). For example, when the etchant temperature at the etching time is set at 150° C. and the temperature drop by the wafer charging is calculated at 5° C., the temperature of the etchant at the time of the wafer charging is assumed at 155° C. The volume of the lifter is preferably reduced to be as small as possible, for example, as shown in FIG. 6. The smaller volume of the lifter reduces the etching bath and cleaning bath in size with the result that the etching liquid consumption can be reduced.

Next, the temperature of the etchant 11 in the etching bath 1 is adjusted at a determined etchant temperature B (step 4). After the temperature of the etchant reaches B, the wafers 10 are charged in the etching bath 1 (step 5).

Immediately before or after charging the wafers, the temperature arrangement of the etchant is changed at a predetermined standard value A (step 6). For example, when the concentration of $H_3PO_4$ is 85%, and an optimum etchant temperature is 150° C., a target of the temperature arrangement is changed to 150° C. from 155° C. Since the change of the liquid temperature involves inertia, it is also possible to change the target temperature immediately before charging the wafers from the viewpoint of reduction of a process time.

After charging the wafers, the wafers 10 are etched for a predetermined time (step 7). Therefore, the wafers 10 are removed from the etching bath 1 and cleaned with water (step 8). The wafers 10 are cleaned with water and dried (step 9). The wafers 10 are unloaded from the etching apparatus (step 10).

The process of the etching has been described. In the method used in the first embodiment, the temperatures B, A of the etchant are controlled to be not more than the boiling temperature. Moreover, in the first embodiment, the number of wafers is counted in the step 2, and the etchant temperature (initial temperature) B at the time of the wafer charging is determined based on the counted result in the step 3. That is, the number of wafers to be charged in the etching bath is recognized beforehand. When the wafers are charged, the etchant temperature is set at the initial temperature B higher than the target temperature (appropriate etching temperature) A in consideration of the temperature drop ($\Delta=B-A$). In and after charging the wafers, the semiconductor substrate, especially the silicon nitride film (SiN) formed on the semiconductor substrate, is etched with high precision, while the temperature is controlled at the target temperature A.

When the above-described process is performed, a stable etching operation can be performed regardless of the number of wafers per batch.

The wafers may also be heated before they are charged, so that a difference between the initial temperature B and the appropriate etching temperature A is minimized. In the method of heating the wafers, for example, as P1*a* as shown in FIG. 1, a preheating chamber is disposed, and the wafers are heated for each carrier, and may thereafter be conveyed into the etching portion P2. In this case, the computer 13 calculates the initial temperature B in consideration of the temperature of the preheated wafers.

SECOND EMBODIMENT

FIG. 8 is a configuration diagram of the etching portion of the etching apparatus according to a second embodiment. The whole configuration diagram is the same as that of the first embodiment, and FIG. 4 is applied to the second embodiment, as well. The etching portion P2 of the second embodiment is basically the same as that of FIG. 5, but is different in that the side-surface heater 9 is attached onto the outside of the inner bath 1*a* of the etching bath 1, in addition to the lower heater 5. It is sufficient that the heater 9 is attached only on an exposed outer surface of the inner bath 1*a*. However, as shown in FIG. 7, the heater 9 may be attached so as to extend between the inner bath 1*a* and outer bath 1*b* up to the top edge thereof and heat the etching liquid up to the upper portion.

This etching apparatus includes the wafer counter 12 and the computer 13 for calculating the initial temperature B at the time of the charging of the wafers based on information from the wafer counter 12. The temperature of the etchant is controlled by a temperature control system constituted of the heaters 4, 5, 9, thermocouples 6, and temperature controller 14.

Since the heaters are formed not only on the bottom surface but also on the side surfaces of the etching inner bath in the second embodiment, the temperature can be controlled more quickly than in the first embodiment.

In the first and second embodiments, the etchant including $H_3PO_4$ has to be drained from the etching bath so as to be circulated. However, as shown in FIGS. 5 and 8, the etchant is drained to the outside from an outer bath of the etching bath. In this manner, a structure in which the heater is prevented from being directly exposed to the etchant is preferable.

Positions where the temperature and concentration are monitored are not limited to those shown in FIGS. 5 and 8. The monitors may be disposed in any place of the etching apparatus. Any known monitor and any known method may be used, including indirect concentration conversion from such as a specific gravity. The pure water may be added in any position in the circulation path.

In a general method of controlling the temperature of $H_3PO_4$, the properties that the boiling point differs with the concentration are utilized (see FIG. 2). More specifically, pure water is added to keep the boiling point constant, with result that an $H_3PO_4$ treatment temperature becomes constant. However, in the present embodiments, the concentration and temperature are managed basically at a temperature not higher than the boiling point.

Next, application examples of the etching apparatus described in the first and second embodiments will be described.

FIRST APPLICATION EXAMPLE

FIGS. 9 to 12 are sectional views showing actual examples in which the above-described etching apparatus is used to etch/remove the silicon nitride film (SiN) formed on the wafer. In more detail, they are sectional views showing steps of coating the semiconductor substrate with a photoresist for forming the deep trench for the capacitors and performing exposure and development.

First, as shown in FIG. 9, a pad layer 23 necessary for the deep trench processing is formed on a semiconductor substrate 21 made of, e.g., silicon. The pad layer 23 is formed of a silicon nitride film (SiN), and is used as a stopper layer of chemical mechanical polishing (CMP) in forming shallow trench isolation (STI) which is a device isolating region. The silicon nitride film 23 is formed on the silicon substrate 21 via a silicon oxide film (Ox) 22.

A silicon oxide film (BSG+TEOS) 24 composed of a stacked film including a BSG film and TEOS film is formed on the silicon nitride film 23. The silicon oxide film 24 is coated with a novolak layer 25. Furthermore, a photoresist 27 patterned in a predetermined shape is formed on the novolak layer 25 via a spin-on-glass (SOG) layer 26.

Next, the patterned photoresist 27 is used as a mask to etch the SOG layer 26 and novolak layer 25 by anisotropic etching such as reactive ion etching (RIE). The pattern having the same shape as that of the photoresist 27 is formed on the novolak layer 25 and SOG layer 26.

Next, the patterned novolak layer 25 is used as the mask to successively etch the silicon oxide film 24, silicon nitride film 23, and silicon oxide film 22 by the RIE, and these stacked films are patterned in the same shape as described above. Thereafter, the novolak layer 25 used as the mask is removed (FIG. 10).

Next, the silicon oxide film 24 patterned in the predetermined shape is used as the mask to form deep trenches 28 in the surface region of the semiconductor substrate 21. Thereafter, the silicon oxide film 24 used as the mask is removed (FIG. 11).

Figure 7:
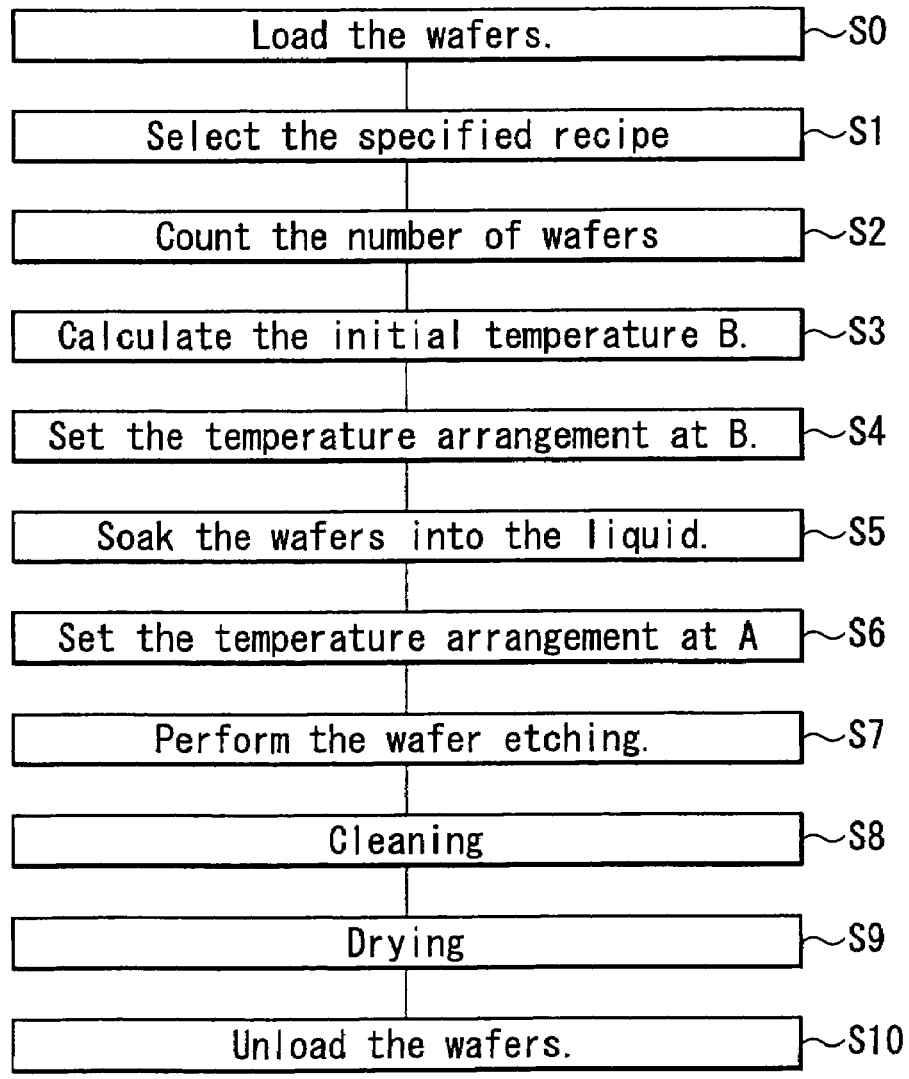
FIG. 7 is a flowchart showing an etching method of the wafer in the first embodiment.

Furthermore, after forming the device isolating region (not shown) in the semiconductor substrate 21 in which the deep trenches 28 are formed, the etching apparatus of FIG. 5 or 7 is used to etch/remove the silicon nitride film (SiN) 24 (FIG. 12).

SECOND APPLICATION EXAMPLE

Figure 13:
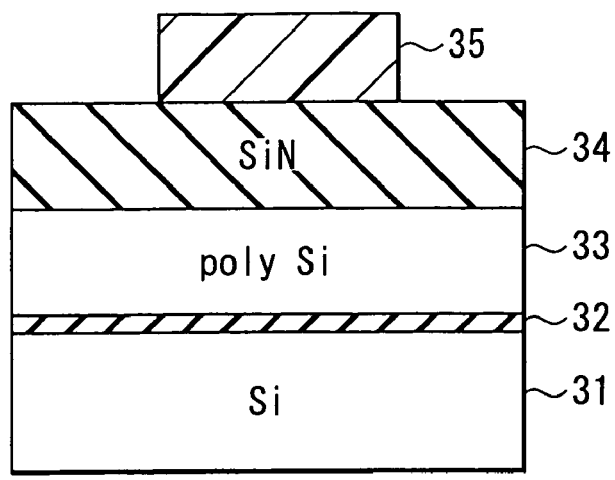
FIGS. 13 to 15 are sectional views of the semiconductor device showing the SiN film etching step at the time of the forming of a silicon gate in a second application example of the etching method of the present invention.
Figure 14:
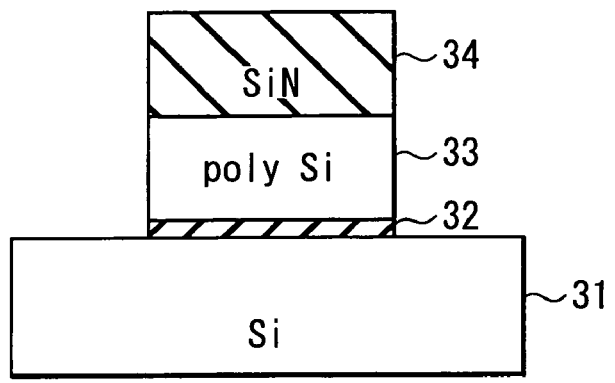
Figure 15:
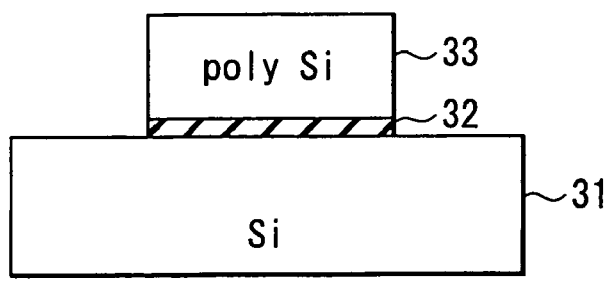

FIGS. 13 to 15 are sectional views of the semiconductor device stepwise showing a process in which the silicon oxide film is used to form a gate electrode. A gate insulating layer ($SiO_2$) 32, polysilicon gate layer 33, and silicon nitride layer 34 are stacked on a semiconductor substrate (Si) 31, and a photo resist 35 patterned in a gate electrode shape is formed as an uppermost layer (FIG. 13).

Subsequently, this photoresist 35 is used as the mask to etch a stacked layer (FIG. 14). Thereafter, the etching apparatus of FIG. 5 or 8 is used to etch/remove the silicon nitride layer 34.

THIRD APPLICATION EXAMPLE

Figure 16:
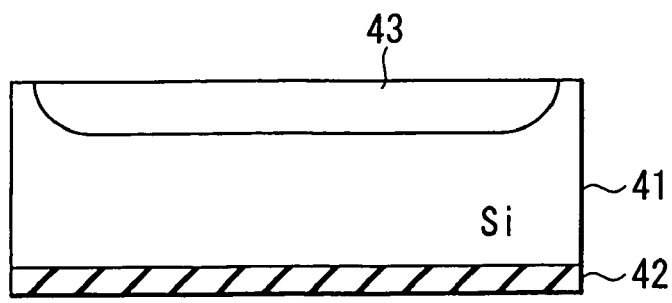
FIG. 16 is a sectional view of the semiconductor device showing the etching step of the SiN film formed on the back surface of a semiconductor substrate in a third application example of the etching method of the present invention.

The etching apparatus of FIG. 5 or 8 can also be used, when the protective film of a silicon nitride film 42, which is formed on the back surface of a semiconductor substrate 41, is etched/removed as shown in FIG. 16.

As described above, the silicon nitride film used in manufacturing the semiconductor device can uniformly, efficiently, and quickly be removed by the etching apparatus of the aforementioned embodiments.

In the embodiments, $H_3PO_4$ is used as the etchant, but the present invention is not limited to this, and can also be applied to a case where chemicals such as sulfuric acid, nitric acid, and hydrofluoric acid are used alone or as a mixture of two or more chemicals.

According to the embodiments, even in batches different in the number of wafers, high-precision etching, in which the etching amount of the silicon nitride film (SiN) is even among the batches or in the batch, is possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for etching semiconductor wafers in an etching apparatus including an etching bath filled with an etchant and capable of setting liquid temperature and process sequence, the method comprising:
   selecting a predetermined etching program suitable for etching of the semiconductor wafer;
   counting a number of the semiconductor wafers to be charged in the etching bath before the etching;
   calculating a temperature drop of the etchant based on the number of the semiconductor wafers;
   setting the liquid temperature of the etchant to an initial temperature B obtained by adding the temperature drop of the etchant to a predetermined etching temperature A, the predetermined etching temperature A being lower than the boiling point of the etchant;
   charging the semiconductor wafers in the etching bath after the liquid temperature reaches the initial temperature B to etch the semiconductor wafers; and
   setting the liquid temperature at the predetermined etching temperature A, immediately before or after charging the semiconductor wafers.

2. The method according to claim 1, wherein the semiconductor wafers are mounted on a holder and are simultaneously subjected to the etchant, and the initial temperature B is calculated including a thermal capacity of the holder.

3. The method according to claim 1, wherein the process sequence is set in such a manner that the temperature of the etchant reaches the initial temperature B in a required time between the counting of the number of the semiconductor wafers and the charging of the semiconductor wafers in the etching bath.

4. The method according to claim 1, further comprising:
monitoring a concentration of the etchant; and
replenishing pure water to keep the concentration of the etchant constant, when the concentration is higher than a desired concentration.

5. The method according to claim 1, further comprising heating the semiconductor wafers before the charging of the semiconductor wafers, so that a difference between the initial temperature B and the predetermined etching temperature A is minimized.

6. The method according to claim 1, wherein the etchant includes $H_3PO_4$ as a major component.

7. The method according to claim 1, wherein the etching is performed to etch a silicon nitride film formed on a surface of each of the semiconductor wafers.

* * * * *